(12) United States Patent
Heydron et al.

(10) Patent No.: US 8,856,555 B2
(45) Date of Patent: Oct. 7, 2014

(54) POWER STATE COORDINATION FOR PORTABLE TEST TOOLS

(75) Inventors: Paul H. Heydron, Everett, WA (US); Christopher Rayburn, Bothell, WA (US); Jeffrey C. Hudson, Snohomish, WA (US)

(73) Assignee: Fluke Corporation, Everett, WA (US)

( * ) Notice: Subject to any disclaimer, the term of this patent is extended or adjusted under 35 U.S.C. 154(b) by 776 days.

(21) Appl. No.: 12/505,417

(22) Filed: Jul. 17, 2009

(65) Prior Publication Data

US 2011/0015796 A1 Jan. 20, 2011

(51) Int. Cl.
| | |
|---|---|
| G06F 1/00 | (2006.01) |
| G06F 13/00 | (2006.01) |
| G06F 3/00 | (2006.01) |
| G08C 23/04 | (2006.01) |
| G08C 17/02 | (2006.01) |

(52) U.S. Cl.
CPC .............. *G08C 23/04* (2013.01); *G08C 17/02* (2013.01)
USPC ................. 713/300; 713/310; 710/8; 710/15; 710/18; 710/19; 710/62; 710/64; 710/72; 710/73; 710/74; 710/104; 710/313

(58) Field of Classification Search
None
See application file for complete search history.

(56) References Cited

U.S. PATENT DOCUMENTS

| | | | | |
|---|---|---|---|---|
| 4,023,078 | A | * | 5/1977 | Olliges et al. ................. 361/753 |
| 4,942,356 | A | * | 7/1990 | Ellingen et al. ............... 324/156 |
| 6,043,640 | A | * | 3/2000 | Lauby et al. .................. 324/127 |
| 6,216,017 | B1 | * | 4/2001 | Lee et al. ....................... 455/567 |
| 8,174,384 | B2 | * | 5/2012 | Stagg .......................... 340/572.1 |
| 2003/0137310 | A1 | | 7/2003 | Holzel |
| 2004/0160410 | A1 | | 8/2004 | Plathe |
| 2004/0239309 | A1 | | 12/2004 | Barr et al. |
| 2007/0035317 | A1 | | 2/2007 | Fazzina |
| 2007/0164980 | A1 | * | 7/2007 | Manning ....................... 345/104 |
| 2010/0181990 | A1 | * | 7/2010 | Hudson et al. ................ 324/115 |
| 2011/0015796 | A1 | * | 1/2011 | Heydron et al. .............. 700/286 |
| 2011/0069961 | A1 | * | 3/2011 | Hudson et al. ................ 398/115 |

FOREIGN PATENT DOCUMENTS

CN 1584606 A 2/2005

OTHER PUBLICATIONS

Chinese Patent Application No. 201010231475.3, Office Action, 23 pages, Mar. 29, 2013.
Chinese Office Action (translation) dated Sep. 30, 2013, in Chinese Application No. 201010231475.3, filed Jul. 19, 2010, 12 pages.

* cited by examiner

*Primary Examiner* — Tanh Nguyen

(74) *Attorney, Agent, or Firm* — Christensen O'Connor Johnson Kindness PLLC

(57) ABSTRACT

A system and method of coordinating power states between two detachable units is disclosed. Only the primary unit has a user-controllable power control. The secondary unit is not directly user controllable. The power states of the two units are coordinated using an actuator mechanism when the units are attached. When the two units are detached, the state of the secondary unit is dependent upon the state of the primary unit and any subsequent commands transmitted by the primary unit to the secondary unit.

18 Claims, 7 Drawing Sheets

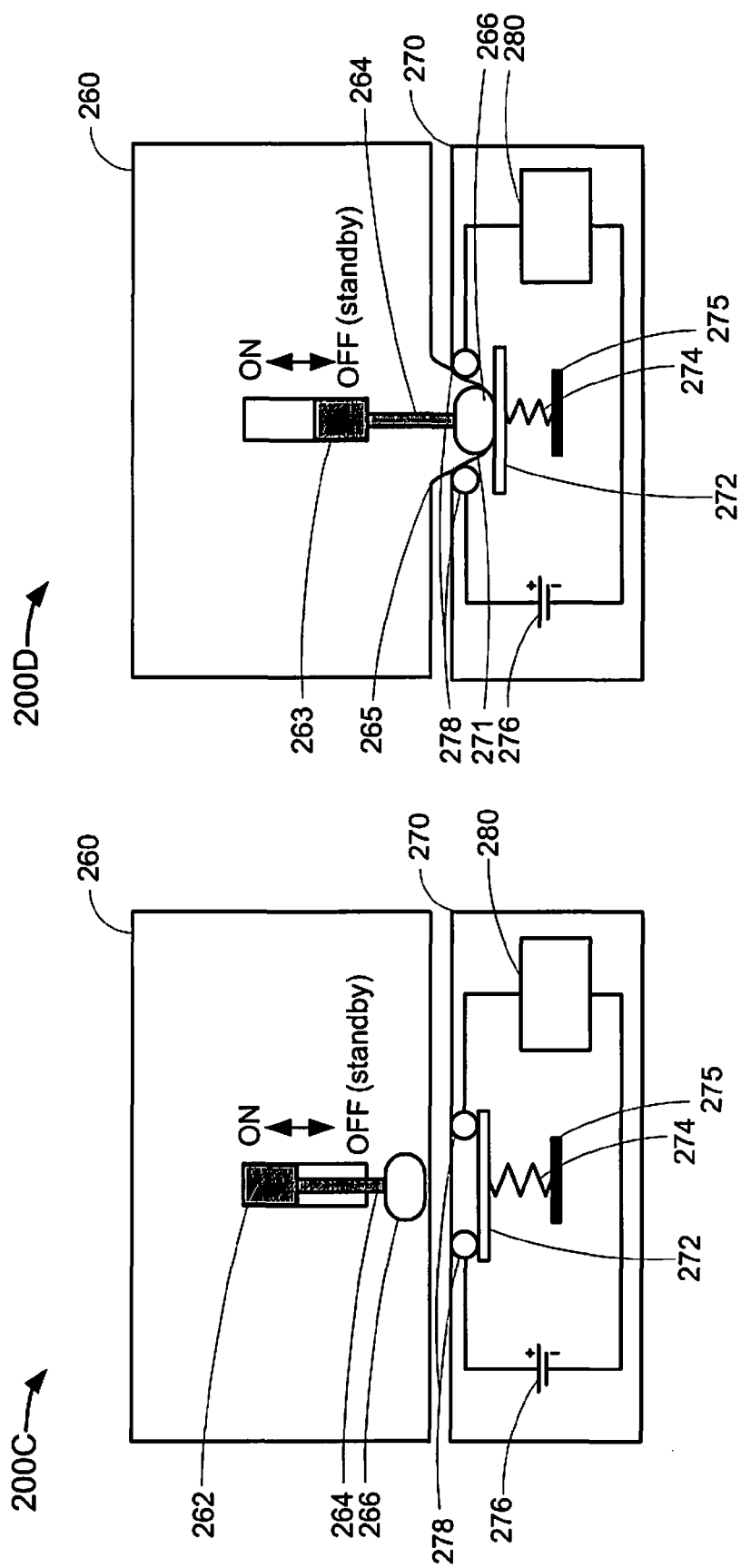

POWER STATE COORDINATION FOR PORTABLE TEST TOOLS

TECHNICAL FIELD

The present disclosure relates to coordinating power states of two or more detachable and re-attachable components of portable measurement tools.

BACKGROUND

Measurement tools are often used in dangerous environments. In dangerous environments, a user of a measurement tool user may be required to wear cumbersome personal protective gear for safety reasons, thus making it awkward to, for example, view the display of a measurement tool. Further, some measurement tools may need to be used in an awkward position that may not allow the instrument to be easily read, for example, a taut cable running vertically close to a wall into an electrical panel may need to be measured with a clamp meter. In order to attach the clamp meter to perform the measurement, the instrument might have to be held or positioned in such a manner that the display on the meter might not be easily visible to the user.

In addition, the measurement may be difficult for a single person to perform given the particular measurement configuration. For example, a current measurement may need to be made with a clamp meter on a conductive cable in an electrical circuit for which the "on" switch is located in an electrical panel some distance away from the cable. In this scenario, two people may be necessary to safely facilitate the measurement. Alternatively, radio or other means of communication between the two people may also be required.

SUMMARY

A measurement tool may have a detachable portion for the convenience or safety of the user. In order to prevent user confusion as to the power state of each of the units, only the primary unit has a user-controllable power control. The power states of the two units are coordinated using an actuator mechanism when the units are attached. When the two units are detached, the state of the secondary unit is dependent upon the state of the primary unit and subsequent commands transmitted by the primary unit to the secondary unit.

BRIEF DESCRIPTION OF THE DRAWINGS

Examples of power state coordination between two detachable units are illustrated in the figures. The examples and figures are illustrative rather than limiting.

FIGS. 2C and 2D show block diagrams illustrating a secondary unit attached to a primary unit and coupled via a non-conducting actuator, when the primary unit has been placed in two different power states, according to an embodiment of the disclosure.

DETAILED DESCRIPTION

Figure 1:
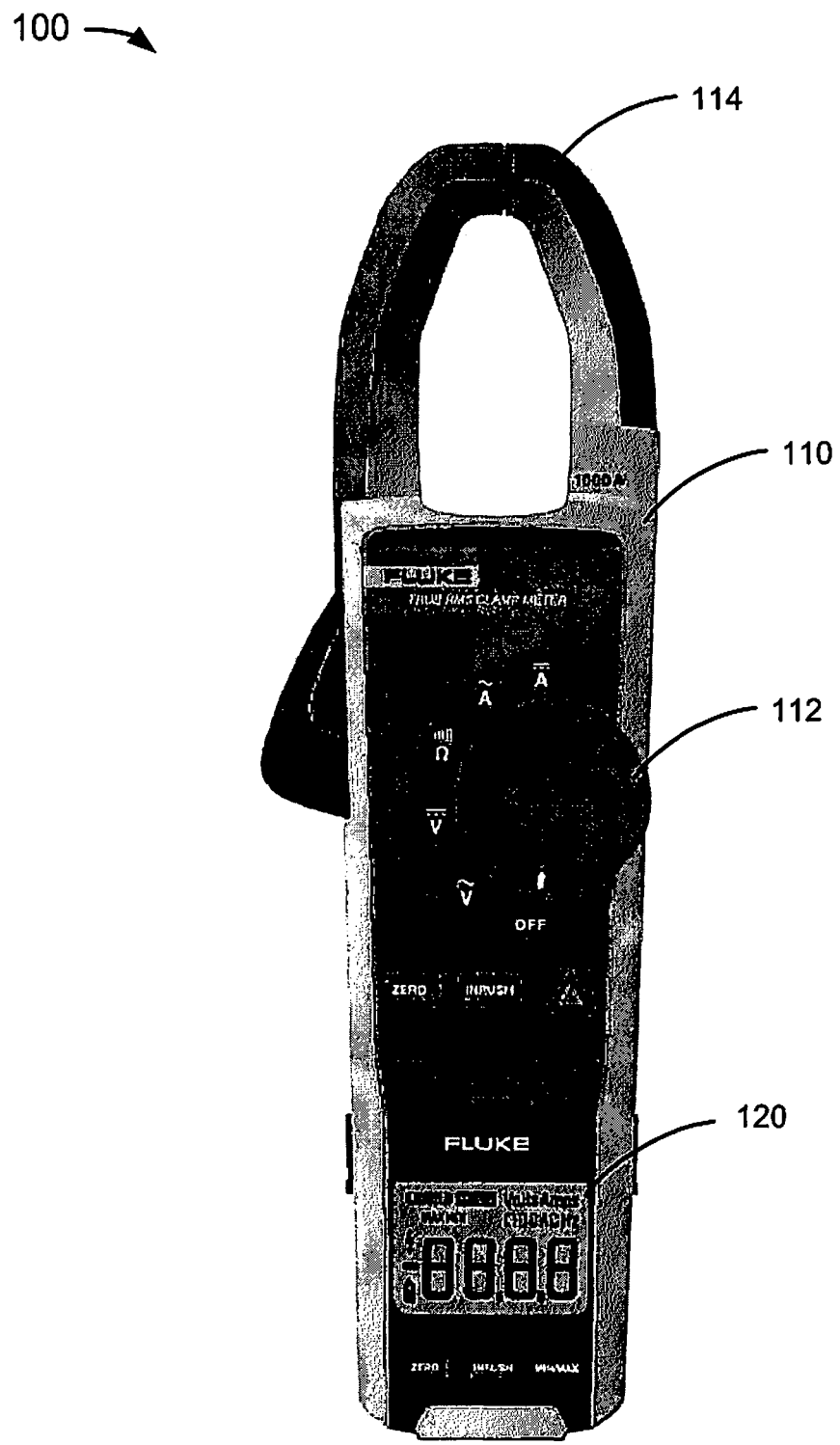
FIG. 1 shows a picture of a clamp meter.

The following description and drawings are illustrative and are not to be construed as limiting. Numerous specific details are described to provide a thorough understanding of the disclosure. However, in certain instances, well-known or conventional details are not described in order to avoid obscuring the description.

Without intent to further limit the scope of the disclosure, examples of instruments, apparatus, methods and their related results according to the embodiments of the present disclosure are given below. Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. The use of examples anywhere in this specification including examples of any terms discussed herein is illustrative only, and is not intended to further limit the scope and meaning of the disclosure or of any exemplified term. Likewise, the disclosure is not limited to various embodiments given in this specification.

The terminology used in the description presented below is intended to be interpreted in its broadest reasonable manner, even though it is being used in conjunction with a detailed description of certain specific examples of the invention. Certain terms may even be emphasized below; however, any terminology intended to be interpreted in any restricted manner will be overtly and specifically defined as such in this Detailed Description section.

In accordance with an exemplary embodiment to be described below, a measurement tool includes one or more components that are detachable. One application where a detachable tool component would be useful is a clamp multimeter (clamp meter) that has a detachable display. For example, the clamp meter may need to be used on cables situated in a location that is hard to access. Thus, if the display were fixed to the clamp meter, it would be inconvenient for a user to view and read the display. In some situations, the environment in which the clamp meter needs to be used requires the user to wear cumbersome personal protective equipment. A removable remote display would allow a second user to view the display while the first user attached the meter to the desired location. In addition, the removable display eliminates the need for communication equipment between two users, and/or unnecessary walking around near, for example, a dangerous access panel.

When one component of an instrument, referred to herein as a secondary unit, is detached from the main instrument or primary unit, the two units need to be able to communicate wirelessly with each other. This problem does not arise when the two components are not detachable because there are wires internal to the instrument over which signals can be transmitted between the components.

Moreover, when the primary and secondary units of an instrument are not detachable, a single power controller on the instrument can be used by a user to turn on the components of the instrument or to place the instrument in any desired power state, including a power-saving mode. However, when the units are detachable, in order to prevent user confusion as to the power state of each of the units, it is desirable to not have separate power controllers on each unit. For example, measuring a high voltage with a clamp meter can be risky because if the user forgets to turn on the display, the user may think that there is no voltage although there is high voltage present. Thus, only the primary unit should have a user-controllable power control.

Additionally, when there are two or more detachable units that are powered by portable power sources, it is advantageous for the units to know when they are mated, in order to establish a power source management solution to save power. When the units are mated, the power states of the two units are coordinated through the used of an actuator mechanism, and an infrared (IR) transceiver, which has a low power draw, can be used to communicate between the units. When the units are not mated, a different communication method would be used, such as a radio frequency (RF) transceiver radio. While the power draw of the RF transceiver is higher, the distance over which the units can communicate is much greater that that of IR transceivers. Further, when the user turns off or puts the primary unit in standby mode to save power, the secondary unit should also be placed in standby mode to save power because if the power source of the secondary unit has been depleted, the primary unit will not be able to effectively function.

FIG. 1 depicts an illustration of a clamp meter 100. The clamp meter has a primary body 110 that houses a control knob 112. As depicted in FIG. 1, the user-controlled control knob 112 can be set to an off position or other on states, such as measuring voltage, current, and resistance. In one embodiment, when the display is detachable, there can be a standby mode in addition to or instead of the off position. The clamp meter also has a clamp 114 for attaching to electronic devices to be measured. The clamp meter can have a removable display 120. The removable display 120 does not have a separate user-controlled power setting.

Although a clamp meter is used as an example for the primary unit and a detachable display is used as an example of the secondary unit throughout the discussion, the disclosure is not limited to this embodiment. The disclosure can be applied to any type of measurement tool that can be powered by batteries or any other portable power source. Non-limiting examples of measurement tools to which the disclosure is applicable include electrical measurement tools; environmental measurement tools that measure parameters such as air quality, temperature, humidity, carbon monoxide, carbon dioxide, and pressure; and chemical measurement tools that measure parameters such as pH, acidity, nitrogen content, oxygen content, phosphate content, and aluminum content for wastewater.

Figure 2A:
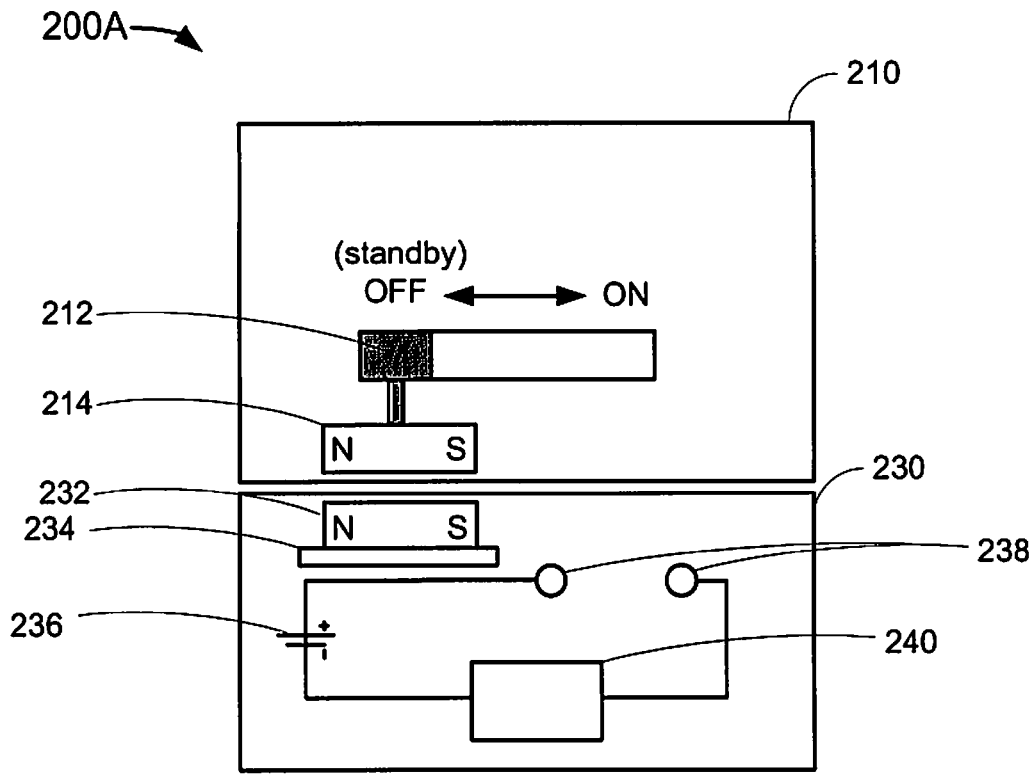
FIGS. 2A and 2B show block diagrams illustrating a secondary unit attached to a primary unit and coupled via a magnetic actuator, when the primary unit has been placed in two different power states, according to an embodiment of the disclosure.
Figure 2B:
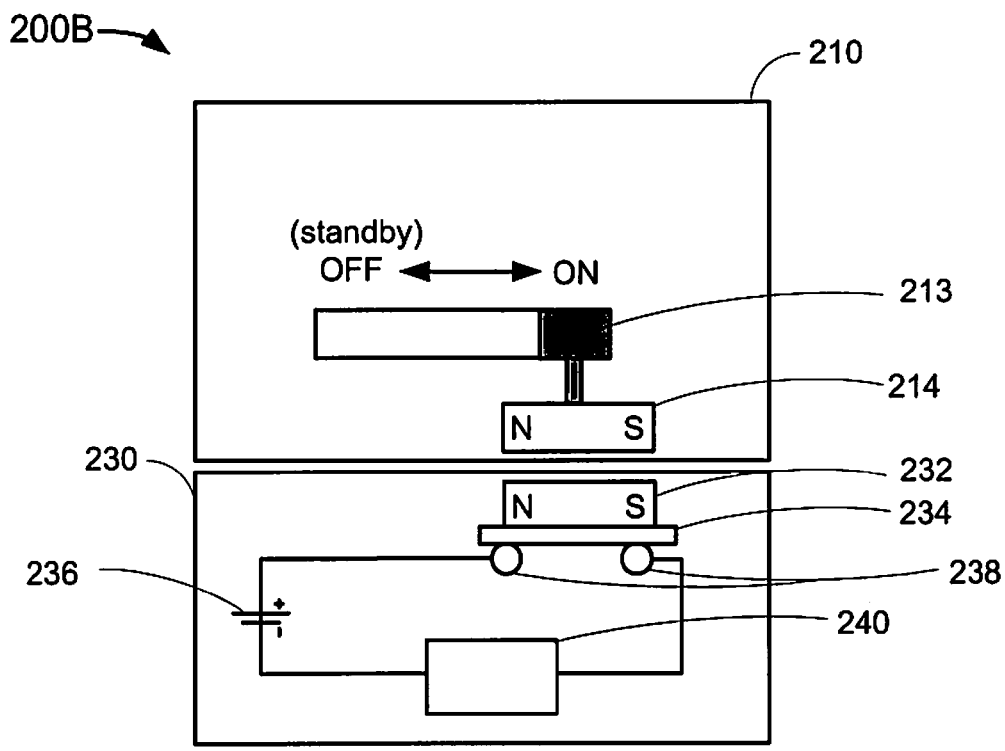

FIGS. 2A and 2B depict block diagrams 200A and 200B illustrating a secondary unit attached to a primary unit and coupled via a magnetic actuator, when the primary unit has been placed in two different power states. FIG. 2A shows the primary unit 210 in an off state or standby mode, while FIG. 2B shows the primary unit 210 in an on state.

Note that for safety considerations, in one embodiment the primary and secondary units do not have any conductive elements on the exterior. For example, if the primary unit were a clamp meter and a user used the clamp meter to measure a high voltage element, it would be very dangerous for the user if the clamp meter were to conduct the measured high-voltage to the interior of the clamp meter because the user could be shocked while using the device.

The primary unit 210 has a user-controlled power controller 212. A user can set the power controller in either an off state or standby mode 212, as shown in FIG. 2A, or in an on state 213, as shown in FIG. 2B. The power controller can also be set for other power states that are not shown. Examples of a power controller include, but are not limited to, a switch, knob, toggle, and button. The power controller 212 is coupled to a magnet 214. The magnet 214 depicted in FIGS. 2A and 2B is a bar magnet, however the magnet can assume any shape or form. In one embodiment, the magnet 214 is placed near the interior of the housing of the primary unit 210, such that the magnetic fields arising from the magnet 214 can be felt by a magnet 232 placed near the interior of the housing of the secondary unit 230 when the primary and secondary units are attached or in close proximity. The primary and secondary units can have additional parts that assist the units to attach more securely. For clarity, these additional parts are not shown. It will be recognized by a person of skill in the art that mechanisms for attaching the primary and secondary units can be used in conjunction with the magnetic actuator.

When the primary and secondary units are attached and the primary unit is placed in the off or standby position by sliding the power controller 212 and correspondingly the primary unit's magnet 214 to the left, the secondary unit's magnet will also slide to the left as a result of the coupling magnetic fields between the magnets, as shown in FIG. 2A. Similarly, when the primary unit is placed in the on position by sliding the primary unit's power controller and magnet 214 to the right, the secondary unit's magnet will also slide to the right, as shown in FIG. 2B.

In one embodiment, attached to the secondary unit's magnet 232 is a conductor 234. In an alternative embodiment, the secondary unit's magnet 232 can be electrically conductive and no additional conductor 234 would be needed. When the primary unit is placed in the on state, the primary magnet slides to the right, as shown in FIG. 2B, and the secondary magnet with its conductor 232 also slides to the right. The conductor makes contact with electrical contacts 238 that are part of the electrical circuit that couples the secondary unit's power supply 236 to the secondary unit's main electronics 240. Not shown in the figure are the electronics coupling the power supply source for the secondary unit that powers the unit's transceivers when the unit is in standby mode. Transceivers are devices that are used by the units to transmit and receive communications to and from each other. Non-limiting examples of transceivers include infrared transceivers, radio frequency transceivers, and two-way radios. Although the main electronics 240, for example a display, is shut off during standby mode, the transceiver electronics are still provided with sufficient power to operate. Thus, when the primary and secondary units are attached, the power state of the secondary unit is coordinated with the user-controlled power state of the primary unit via the actuator mechanism. In one embodiment, coordination of power states between the secondary unit and primary unit does not necessarily have to be one-to-one. For example, in addition to the off or standby state, the primary unit can have more than one on state, for example, the primary unit can be set to measure different parameters in different on states. However, the secondary unit may only have one on state that corresponds to any of the on states of the primary unit, while the secondary unit's off or standby state corresponds directly to when the primary unit is placed in the off or standby state. In one embodiment, the secondary unit can include an indicator that it has been placed in the standby or off state so that a user can immediately determine the status of the secondary unit.

FIGS. 2C and 2D depict block diagrams 200C and 200D illustrating a secondary unit attached to a primary unit and coupled via a plastic actuator in two different power states. FIG. 2C shows the primary unit 260 in an off state or standby mode, while FIG. 2D shows the primary unit 270 in an on state.

Similar to the above description, the primary unit 260 has a user-controlled power controller 262 that can be set in either an off state or standby mode 262, as shown in FIG. 2C, or in an on state 263, as shown in FIG. 2D. For clarity, other states that the primary unit can be set to are not shown. The power controller need not be a switch, but can take any form, for example, a knob or button. The power controller is coupled to a plunger 266 through an arm 264.

The secondary unit 270 has a power supply 276 used to power the secondary unit's main electronics 280. The circuit between the power supply 276 and the main electronics 280 is a power supply switch. The switch includes two electrical contacts 278 that make contact with a conductor 272 that can take any suitable form, for example, a plate or bar. In one embodiment, the conductor 272 is coupled via a spring 274 to a fixed location 275. The conductor 272 can be attached to fixed location 275 through any other structural mechanism, for example, the conductor 272 can be cantilevered in place. As shown in FIG. 2C, when there is no downward force on the conductor 272, the spring 274 forces the conductor upwards to make contact with the electrical contacts 278, thus completing the circuit between the power supply 276 and the main electronics 280. Although the 'downward' direction is used in the description, the term 'downward' only refers to the relative direction between the primary and secondary units.

In one embodiment, to prevent violation of creepage and clearance requirements, the primary and secondary units can be enclosed with a seal along the surfaces of the units that come into close proximity when attached. The seal for one or both of the primary and secondary units can have the properties of a flexible membrane, bendable and non-conductive. As shown in FIG. 2D, when the power controller 262 is moved to the off state or standby mode 263, the arm 264 pushes the plunger 266 downwards through the flexible membrane 265 of the primary unit 260 and the flexible membrane 271 of the secondary unit 270 to drive the conductor 272 downwards, away from the electrical contacts 278. The downward force of the plunger on the conductor 272 compresses the spring that pushes against the fixed location 275. Thus, the electrical path between the power supply 276 and the main electronics is interrupted, essentially placing the secondary unit in the off or standby mode. Although the power supply to the main electronics 280 is interrupted through the action of the actuator, the secondary circuit can still be in a low-power mode such that the transceivers (not shown) remain powered.

Figure 3:
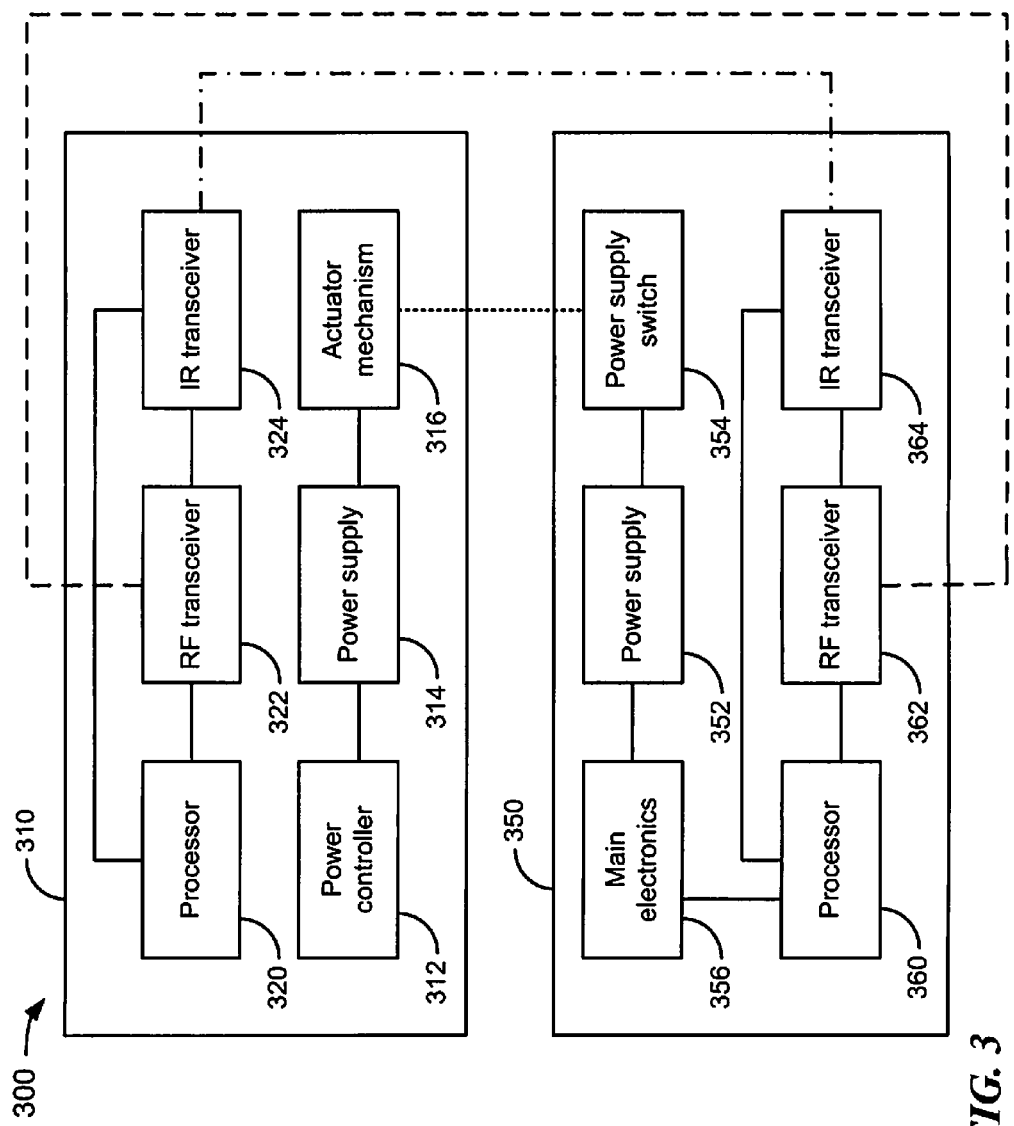
FIG. 3 shows a block diagram of a primary unit and a secondary unit, according to an embodiment of the disclosure.

FIG. 3 shows a block diagram 300 of a primary unit 310 and a secondary unit 350, according to an embodiment of the disclosure. The primary unit 310 can include one or more processors 320, RF transceivers 322, IR transceivers 324, power controllers 312, power supplies 314, and actuator mechanisms 316. The secondary unit 350 can include one or more processors 360, RF transceivers 362, IR transceivers 364, main electronics 356, power supplies 352, and power supply switches 354.

The processors 320, 360 can be used to run applications for the primary and secondary units. The RF transceivers 322, 362 are used to transmit and receive radio frequency transmissions between the units, while the IR transceivers 324, 364 are used to transmit and receive infrared transmissions between the units. The power supplies 314, 352 can be batteries or any other portable direct current (DC) power source. Additionally or alternatively, the primary unit's power supply 314 can be an alternating current (AC) power source such as a wall outlet. The power controller 312 can be any user-controlled mechanism for placing the primary unit in different power states including, but not limited to, an on state and a standby state. The actuator mechanism 316 is used to couple the power state of the primary unit to the power supply switch 354 of the secondary unit when the units are attached to coordinate the power states of the two units. As described above, there may or may not be a one-to-one correspondence between the power states of the secondary unit and the power states of the primary unit. The power supply switch 354 can couple or interrupt the power supply 352 in the secondary unit to the main electronics 356. The main electronics 356 perform the main function of the secondary unit, for example, displaying data received from the primary unit.

Figure 4:
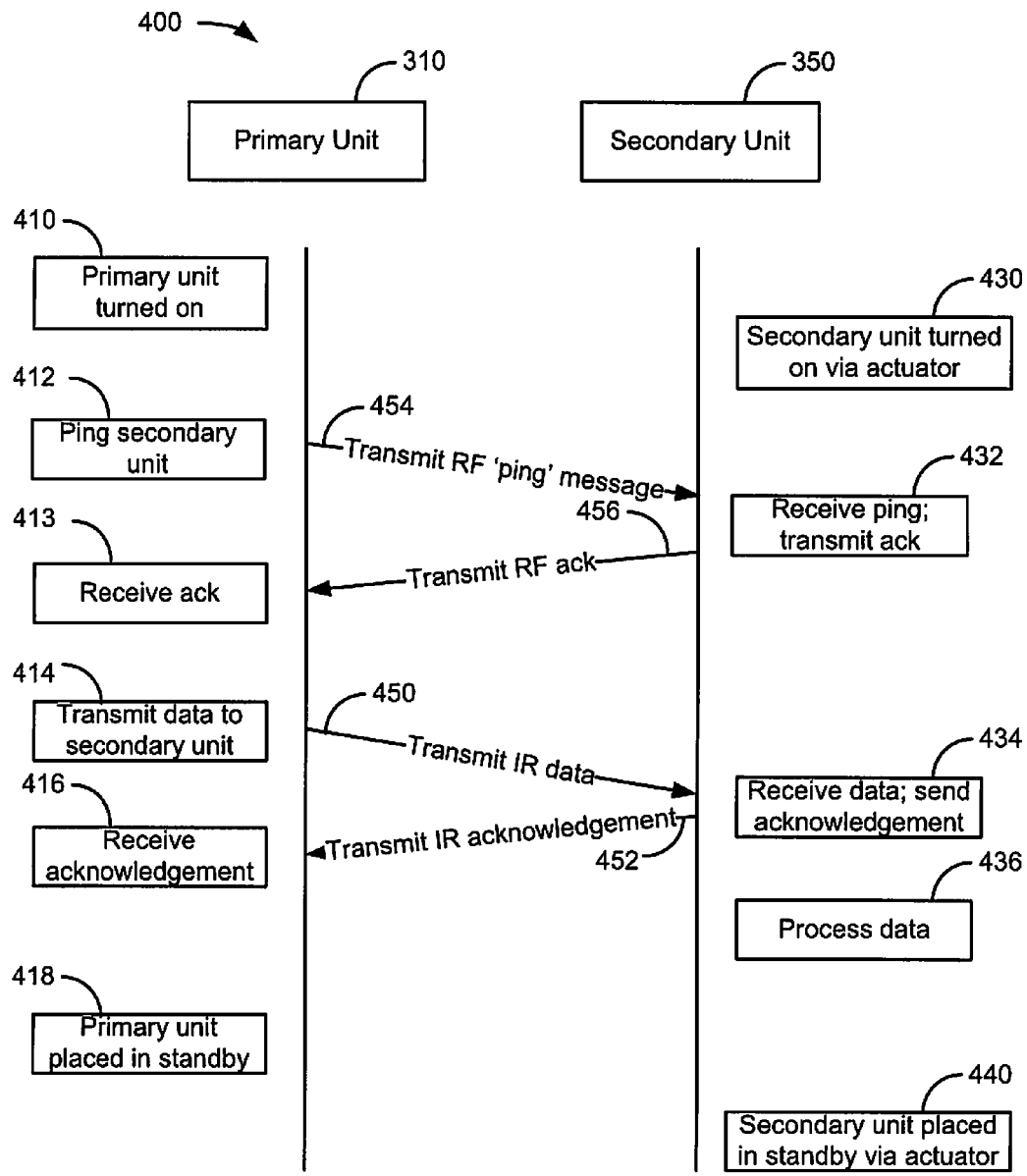
FIG. 4 depicts a flow diagram illustrating an example communication process between a primary unit and a secondary unit when the units are attached.

FIG. 4 is a flow chart 400 illustrating an example communication process 400 between a primary unit 310 and a secondary unit 350 when the units remain attached. The actions of the primary unit 310 on the left and the secondary unit 350 on the right are shown relative to each other as a function of time, with time increasing in the downwards direction in FIG. 4. Transmissions from the primary unit to the secondary unit or vice versa are shown by the arrows crossing the center of FIG. 4.

At block 410, the power controller on the primary unit 310 is turned on by a user in preparation to use the primary unit 310 in conjunction with the secondary unit 350. When the primary unit is turned on, an actuator is triggered, and the circuit to the power supply in the secondary unit is completed so that the secondary unit is also turned on at block 430. As described above, the actuator mechanism can include, but is not limited to, a magnetic actuator and a non-conducting actuator.

In one embodiment, the infrared (IR) transceiver in the primary unit and the secondary unit are always on, irrespective of the power state of the units. The IR transceivers allow the primary and secondary units to communicate with each other in a low power mode while the units are attached. In one embodiment, the transmission power of the transceivers can be adjusted such that when the primary and secondary units are detached, the units are no longer within IR range of each other. In another embodiment, when the units remain within a short distance of each other, they will still be within communication range. Beyond the IR range of the transceivers, the units will not be able to communicate via the IR transceivers. As described below, when the units are detached, the units can use radio frequency (RF) transceivers to communicate with each other. Although the RF transceivers require more power than the IR transceivers, the RF transceivers are more reliable over a longer distance and would be used when the units are detached.

At block 412, the primary unit uses its IR transceiver to ping the secondary unit using transmission 454. Because the units are attached, they are within IR range of the transceivers, and at block 432, the secondary unit receives the ping and transmits an acknowledgement to the primary unit using IR transmission 456. At block 413, the primary unit receives the acknowledgement. The primary unit periodically pings the secondary unit using its IR transceiver to ensure that the units are still attached. Thus, for each ping, blocks 412, 432, and 413 are repeated along with the appropriate transmissions 454, 456.

At block 414 the primary unit transmits data using an IR transceiver in transmission 450 to the secondary unit. For example, if the secondary unit were a display unit, the primary unit would transmit data to be shown on the display. At block 434, the secondary unit receives the data and sends an acknowledgement 452 that the data has been received to the primary unit using its IR transceiver. At block 416, the primary unit receives the acknowledgement. In one embodiment, user controlled settings on the secondary unit are transmitted to the primary unit in acknowledgement 452. For example, if the secondary unit is a display and the primary unit is a clamp meter, a user may use buttons or other controls on the display to change the units or sensitivity of the display. These hardware setting changes are then sent back to the primary unit. After receiving the data, the secondary unit processes the data at block 436. For the example where the secondary unit is a display, at block 436, the data from the primary unit is displayed by the secondary unit. The portion of the flow chart including blocks 414, 434, 416, and 436 along with appropriate transmissions 450, 452 can be repeated as many times as necessary for data to be transmitted from the primary to the secondary unit.

After the primary unit has transmitted the relevant data, the primary unit resumes pinging the secondary unit periodically to ensure that the units are still attached. Thus, again blocks 412, 432, and 413 are repeated, as necessary, along with the appropriate transmissions 454, 456.

At block 418, the power control on the primary unit is turned off by the user when the user is finished; this places the primary unit in a standby mode. In response, the actuator in the primary unit is triggered, and the circuit to the power supply in the secondary unit is interrupted so that the main electronics, such as the display, in the secondary unit does not receive power from its power source and is effectively shut off at block 440. Although the display may be off, the secondary unit still operates in a standby mode where its IR transceiver is capable of transmitting and receiving IR communications. When both the primary and secondary units are in standby mode, the units remain powered in a low-power mode so that the IR transceiver can still operate. The primary unit continues to periodically ping the secondary unit to ensure the units have not been detached. Thus, again blocks 412, 432, and 413 are repeated, as necessary, along with the appropriate transmissions 454, 456. The description for FIGS. 5A and 5B below will detail the case for when the units are detached and no longer within IR range.

Figure 5A:
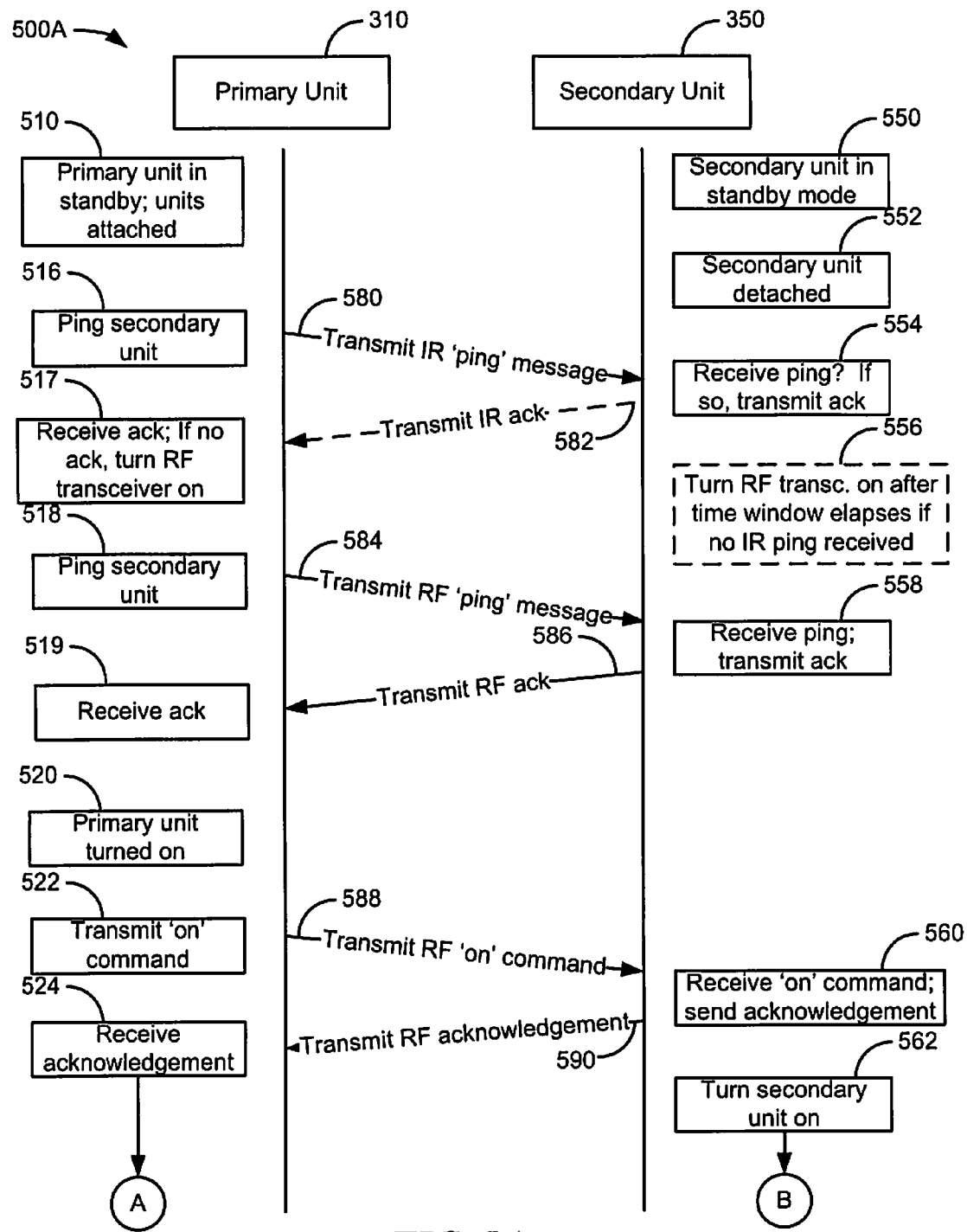
FIGS. 5A and 5B depict a flow diagram illustrating an example communication process between a primary unit and a secondary unit when the units are initially attached but are subsequently detached.
Figure 5B:
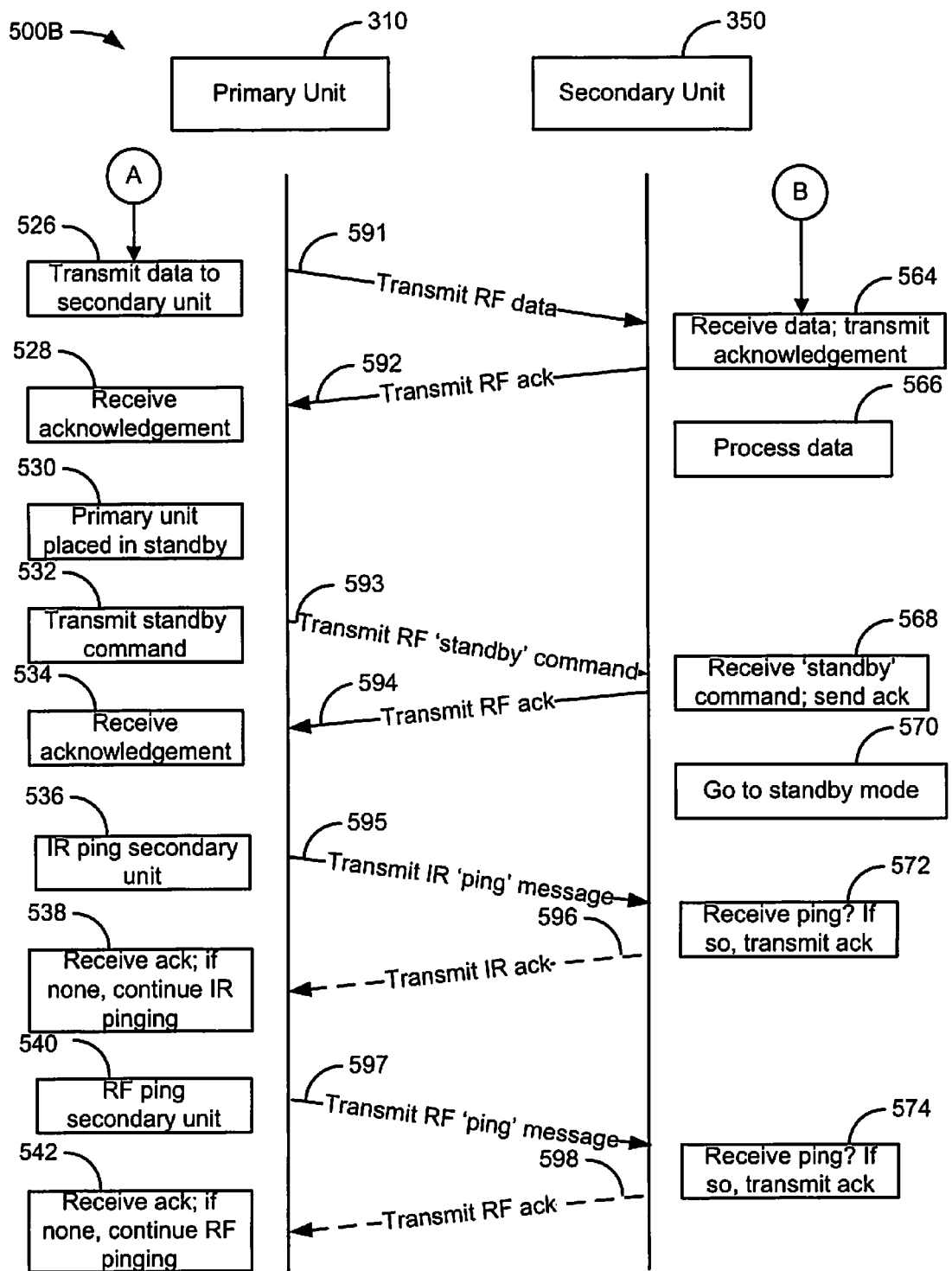

FIGS. 5A and 5B illustrate an example communication process 500A, 500B between a primary unit 310 and a secondary unit 350 when the units are initially attached but are subsequently detached and the primary unit is initially in standby mode. The actions of the primary unit 310 on the left and the secondary unit 350 on the right are shown relative to each other as a function of time, with time increasing in the downwards direction in FIGS. 5A and 5B. Transmissions from the primary unit to the secondary unit or vice versa are shown by the arrows crossing the center of FIGS. 5A and 5B.

At block 510, the primary unit is initially in standby mode, and the primary unit is attached to the secondary unit. Because the actuator mechanism in the primary unit coordinates the power states of the attached units, at block 550 the secondary unit is also placed in standby mode. At block 552, the secondary unit is detached from the primary unit by the user.

Whether or not the units are attached, the primary unit attempts to maintain contact with the secondary unit by periodically sending a brief IR transmission 580, such as a ping, block 516. At block 554, the secondary unit awaits the periodic pings sent by the primary unit. If the secondary unit receives the ping, it transmits an acknowledgement at block 554 using transmission 582. Otherwise, if the secondary unit does not receive an IR ping after a predetermined time window has elapsed, the secondary unit turns on its RF transceiver at block 556. The predetermined time window is typically greater than the amount of time that elapses between periodic transmissions of the primary unit's pings. At block 517, the primary unit receives any acknowledgement sent by the secondary unit. If the primary unit does not receive an acknowledgement from the secondary unit at block 517, the primary unit turns on its RF transceiver. Although the RF transceivers in both of the units have been turned on, the IR transceivers in both units remain on, and the primary unit continues to periodically ping the secondary unit by repeating blocks 516, 554, and 517 with appropriate transmissions 580, 582. This process is used to determine whether the units are attached.

At block 518, the primary unit sends a ping in transmission 584 to the secondary unit using its RF transceiver. At block 558, the secondary unit receives the ping and transmits an acknowledgement in transmission 586 back to the primary unit. The primary unit receives the acknowledgement at block 519. The primary unit continues to periodically ping the secondary unit using its IR transceiver but at a lower rate than it uses to ping the secondary unit using its RF transceiver. If the units are re-attached or come within IR range of each other again, the secondary unit will be able to pick up the IR pings from the primary unit and send an acknowledgement. When the secondary unit is able to receive the IR pings again, the secondary unit turns off its RF transceiver to save power. Similarly, when the primary unit receives an acknowledgement to its IR pings again, the primary unit also turns off its RF transceiver. The primary unit still continues to ping the secondary unit using its IR transceiver.

If the primary and secondary units are detached, as determined by whether the units are within IR range, and thus communicating using RF transceivers, when the primary unit is turned on by a user at block 520, at block 522 the primary unit transmits an RF command 588 to the secondary unit to turn on. The secondary unit receives the command at block 560 and sends an acknowledgement 590 back to the primary unit using its RF transceiver. At block 524, the primary unit receives the acknowledgement, and at block 562, the secondary unit turns on. The secondary unit can be turned on by completing the circuit between the main electronics and the power supply as described above. Alternatively, a switch completing an alternative circuit to the power supply can be used to place the secondary unit in the on state.

At block 526, the primary unit transmits data to the secondary unit using its RF transceiver through transmission 591. The secondary unit receives the data at block 564 and transmits an acknowledgement 592. The primary unit receives the acknowledgement at block 528, and the secondary unit processes the data at block 566.

At block 530, the user places the primary unit in standby mode, while the secondary unit is detached. In standby mode, the IR transceivers remain powered to determine if the units are attached. In addition, if the RF transceivers were on when the primary unit is placed in standby mode, the RF transceivers will also remain powered.

At block 532, the primary unit sends a command to the secondary unit to enter standby mode using RF transmission 593. The secondary unit receives the standby command and sends an acknowledgement 594 at block 568. The primary unit receives the acknowledgement at block 534. As a result of the command, the secondary unit enters standby mode by interrupting power to all circuits except the IR and RF transceivers.

At block 536, the primary unit continues to send an IR ping to the secondary unit using transmission 595. Then at block 572, if the secondary unit receives the IR ping, the units are within IR range, and it sends an IR acknowledgement 596 back and turns off its RF transceiver to save power. If there is an acknowledgement sent, the primary unit receives the acknowledgement at block 538 and turns off its RF transceiver. Otherwise, the primary unit continues to periodically ping the secondary unit using its IR transceiver, repeating blocks 536, 572, and 538 and appropriate transmissions 595, 596.

Meanwhile, the primary unit also sends an RF ping to the secondary unit periodically using transmission 597. At block 574, if the secondary unit receives the RF ping, it sends an RF acknowledgement 598 back. If the acknowledgement is sent, the primary unit receives it at block 542. Otherwise, the primary unit continues to periodically ping the secondary unit using its RF transceiver, repeating blocks 540, 574, and 542, with appropriate transmissions 597, 598. Note that the frequency of the IR pings is lower than the frequency of the RF pings.

If the secondary unit were re-attached to the primary unit, the units would be within IR range again, and both RF transceivers would turn off, as described above. Also, because the actuator in the primary unit coordinates the power states of the two units, no transmissions between the units are needed to coordinate the power states of the primary and secondary units when they are attached.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." As used herein, the terms "connected," "coupled," or any variant thereof, means any connection or coupling, either direct or indirect, between two or more elements; the coupling of connection between the elements can be physical, logical, or a combination thereof. Additionally, the words "herein," "above," "below," and words of similar import, when used in this patent application, shall refer to this application as a whole and not to any particular portions of this application. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

The above detailed description of embodiments of the disclosure is not intended to be exhaustive or to limit the teachings to the precise form disclosed above. While specific embodiments of, and examples for, the disclosure are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations. Each of these processes or blocks may be implemented in a variety of different ways. Also, while processes or blocks are at times shown as being performed in series, these processes or blocks may instead be performed in parallel, or may be performed at different times. Further any specific numbers noted herein are only examples: alternative implementations may employ differing values or ranges.

The teachings of the disclosure provided herein can be applied to other systems, not necessarily the system described above. The elements and acts of the various embodiments described above can be combined to provide further embodiments.

While the above description describes certain embodiments of the disclosure, and describes the best mode contemplated, no matter how detailed the above appears in text, the teachings can be practiced in many ways. Details of the system may vary considerably in its implementation details, while still being encompassed by the subject matter disclosed herein. As noted above, particular terminology used when describing certain features or aspects of the disclosure should not be taken to imply that the terminology is being redefined herein to be restricted to any specific characteristics, features, or aspects of the disclosure with which that terminology is associated. In general, the terms used in the following claims should not be construed to limit the disclosure to the specific embodiments disclosed in the specification, unless the above Detailed Description section explicitly defines such terms. Accordingly, the actual scope of the disclosure encompasses not only the disclosed embodiments, but also all equivalent ways of practicing or implementing the disclosure under the claims.

What is claimed is:

1. An apparatus comprising:
a primary unit configured to measure one or more parameters, wherein the primary unit is configured with a user-controlled power controller used for setting a power state of the primary unit, wherein the primary unit is further configured with a magnetic actuator, wherein the magnetic actuator is positioned within a housing of the primary unit, and wherein the magnetic actuator is coupled to the user-controlled power controller; and
a secondary unit, wherein the secondary unit is detachable from the primary unit,
wherein when the secondary unit is attached to the primary unit the magnetic actuator coordinates a power state of the secondary unit with the power state of the primary unit by mechanically setting a position of a conductive element magnetically coupled to the magnetic actuator, wherein the conductive element is in a housing of the secondary unit, and
wherein the power state of the primary unit and the power state of the secondary unit each include at least an on state and a standby state.

2. The apparatus of claim 1, wherein when the secondary unit is detached from the primary unit, the power state of the secondary unit is determined at least by the power state of the primary unit and one or more commands from the primary unit.

3. The apparatus of claim 1, wherein the primary unit has a non-conductive external surface.

4. The apparatus of claim 1, wherein the secondary unit has a non-conductive external surface.

5. The apparatus of claim 1, wherein the primary unit and the secondary unit are each configured to have an infrared transceiver for communicating with each other, wherein the primary unit is configured to determine that the secondary unit is detached when the infrared transceiver of the primary unit and the infrared transceiver of the secondary unit are outside of an infrared signal range of each other.

6. The apparatus of claim 5, wherein the primary unit and the secondary unit are configured to communicate using the infrared transceivers when attached to each other.

7. The apparatus of claim 6, wherein the primary unit and the secondary unit are each further configured to have a radio frequency transceiver for communicating with each other.

8. The apparatus of claim 7, wherein the primary unit and the secondary unit are configured to communicate using the radio frequency transceivers when detached from each other.

9. The apparatus of claim 1, wherein coordinating the power state of the secondary unit with the power state of the primary unit comprises:
   placing the secondary unit in an on state if the primary unit is placed by the user in an on state; and
   placing the secondary unit in a standby or off state if the primary unit is placed by the user in a standby or off state.

10. An apparatus that coordinates power states between two attachable units, comprising:
   a primary unit in a first housing, comprising:
      a power controller coupled to a first power supply and configured to be controllable by a user, wherein the power controller is configured to place the primary unit in one of at least two states including:
         a primary standby state, wherein one or more portions of a first communications electronics in the primary unit are powered: and
         a primary on state, wherein electronics in the primary unit other than the first communications electronics are powered; and
      a magnetic actuator coupled to the power controller, wherein when the power controller places the primary unit in the primary on state, the magnetic actuator moves to a first actuator state that mechanically sets a position of a conductive element in a secondary unit to place the secondary unit in a secondary on state when attached to the primary unit, the conductive element magnetically coupled to the magnetic actuator, and further wherein when the power controller places the primary unit in the primary standby state, the magnetic actuator moves to a second actuator state that mechanically sets the conductive element in the secondary unit to place the secondary unit in a secondary standby state when attached to the primary unit; and
   the secondary unit in a second housing, comprising:
      a secondary power supply configured to power at least a portion of the secondary unit and operate in one of at least two states:
         the secondary standby state, wherein one or more portions of a first communications electronics in the secondary unit are powered; and
         the secondary on state, wherein electronics in the secondary unit other than the first communications electronics are powered,
      wherein when the secondary unit is attached to the primary unit, the conductive element is configured to interrupt the secondary power supply when the magnetic actuator moves to the first actuator state, and to couple the secondary power supply when the magnetic actuator moves to the second actuator state,
      wherein the first communications electronics in the primary unit and the first communications electronics in the secondary unit each include an infrared transceiver, wherein the primary unit is configured to determine that the secondary unit is detached when the infrared transceiver of the primary unit and the infrared transceiver of the secondary unit are outside of an infrared signal range of one another.

11. The apparatus of claim 10, wherein the primary unit has a non-conductive external surface.

12. The apparatus of claim 10, wherein the secondary unit has a non-conductive external surface.

13. The apparatus of claim 10, wherein the first communications electronics in the primary unit are configured to communicate with the secondary unit; and at least one first processor is coupled to the first power supply and the first communications electronics in the primary unit, wherein the first processor is configured to:
   process communications from the secondary unit; and
   based upon the communications from the secondary unit, power one or more portions of the first communications electronics in the primary unit; and
further wherein:
   the first communications electronics in the secondary unit are configured to communicate with the primary unit; and
   at least one second processor is coupled among the secondary power supply, the first communications electronics in the secondary unit, and the conductive element, wherein the second processor is configured to:
      process communications from the primary unit; and
      based upon the communications from the primary unit, power one or more portions of the first communications electronics in the secondary unit.

14. The apparatus of claim 13, wherein when the primary unit and the secondary unit are attached, the primary unit and the secondary unit communicate using the infrared transceivers.

15. The apparatus of claim 14, wherein the first communications electronics in the primary unit and the first communications electronics in the secondary unit each include a radio frequency transceiver.

16. The apparatus of claim 15, wherein when the primary unit and the secondary unit are determined to be detached and beyond range of infrared transceivers, the primary unit and the secondary unit communicate using the radio frequency transceivers.

17. A method of coordinating power states between a primary unit and a secondary unit of an apparatus, the method comprising:
   determining that the primary unit and the secondary unit are communicatively attached to one another when the primary unit and secondary unit are within an infrared signal range of one another;
   when the primary unit and the secondary unit are attached to one another and a user uses a power controller to turn the primary unit from on to standby mode, a magnetic actuator coupled to the power controller mechanically sets a position of a conductive element magnetically coupled to the magnetic actuator to interrupt a secondary power supply in the secondary unit, wherein the primary unit has a housing, and the power controller and the magnetic actuator are in the housing of the primary unit, and further wherein the secondary unit has a housing, and the conductive element is in the housing of the secondary unit; and
   when the primary unit and the secondary unit are attached and a user uses the power controller to turn the primary unit from standby mode to on, the magnetic actuator mechanically sets a position of the conductive element to connect the secondary power supply in the secondary unit.

18. The apparatus of claim 10, wherein a second communications electronics in the primary unit are powered in the primary on state, and wherein a second communication electronics in the secondary unit are powered in the secondary on state.

* * * * *